(12) United States Patent
Fjelstad

(10) Patent No.: US 6,317,974 B1
(45) Date of Patent: *Nov. 20, 2001

(54) METHODS FOR CREATING WEAR RESISTANT CONTACT EDGES

(75) Inventor: Joseph Fjelstad, Sunnyvale, CA (US)

(73) Assignee: Tessera, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/168,259

(22) Filed: Oct. 8, 1998

Related U.S. Application Data

(60) Provisional application No. 60/061,522, filed on Oct. 9, 1997.

(51) Int. Cl.$^7$ .................................................. H01R 9/00
(52) U.S. Cl. .................. 29/843; 29/825; 29/842
(58) Field of Search .................... 29/846, 847, 825, 29/830, 827, 843, 842

(56) References Cited

U.S. PATENT DOCUMENTS

| | | | |
|---|---|---|---|
| 3,850,711 | * | 11/1974 | Conley . |
| 4,179,800 | * | 12/1979 | Takaba et al. ............... 427/97 |
| 4,371,589 | | 2/1983 | Warner et al. ............... 428/553 |
| 5,397,957 | * | 3/1995 | Zimmerman . |
| 5,546,655 | * | 8/1996 | Feger et al. . |
| 5,615,824 | * | 4/1997 | Fjelstad et al. . |
| 5,632,631 | * | 5/1997 | Fjelstad et al. . |
| 5,680,701 | * | 10/1997 | Sippel ............................ 427/97 |
| 5,802,699 | * | 9/1998 | Fjelstad et al. . |
| 5,980,270 | * | 11/1999 | Fjelstad et al. . |

* cited by examiner

Primary Examiner—Carl J. Arbes
(74) Attorney, Agent, or Firm—Lerner, David, Littenberg, Krumhholz & Mentlik, LLP

(57) ABSTRACT

A method of making a contact having a wear resistant edge by forming a photoresist layer on a copper clad polyimide composite structure, patterning the photoresist layer to expose a portion of the copper; etching the copper to form a contact and/or contact tabs having etched edges, and plating a wear resistant material on the etched edges. After the photoresist layer is stripped, the top portion of the contact and/or contact tabs are etched to height that is below the height of the wear resistant edge.

41 Claims, 5 Drawing Sheets

METHODS FOR CREATING WEAR RESISTANT CONTACT EDGES

CROSS REFERENCE TO RELATED APPLICATIONS

The present application claims benefit of United States Provisional Patent Application 60/061,522, filed Oct. 9, 1997, the disclosures of which is hereby incorporated by reference herein.

BACKGROUND OF THE INVENTION

1. Field of the Invention

The present invention relates to contacts for microelectronic components such as semiconductor chips and associated circuit panels, connectors, sockets and related devices. Specifically, the present invention is directed to the forming of a wear resistant edge on the contacts on microelectronic components.

2. Description of the Related Art

Contacts for microelectronic components are typically formed from copper or other relatively soft or easily deflectable materials. The contacts engage terminals (such as pins or solder balls) on adjacent microelectronic components forming electrical connections. To improve the electrical connection, the contacts may wipe or otherwise abrade the pads or solder bumps as those elements are engaged, breaking through any oxide layer in order to electrically connect with the clean, un-oxidized material below.

Commonly assigned U.S. Pat. No. 5,802,699, the disclosure of which is hereby incorporated by reference herein, discloses a connector for mounting a microelectronic element to a substrate. In one embodiment, the connector has a body having a plurality of holes disposed in an array corresponding to an array of bump leads on the microelectronic device to be mounted. The connector also has an array of resilient contacts secured to the body in registration with the holes. Each contact is adapted to resiliently engage a bump lead inserted into the associated hole. An array of terminals are electrically connected to the contacts such that a microelectronic component can be connected to a substrate by bonding the terminals to the substrate and superposing the microelectronic element on the body. The bump leads on the component protrude into the holes and are engaged by the resilient contacts.

Certain embodiments disclosed in commonly assigned U.S. Pat. No. 5,632,631, the disclosure of which is hereby incorporated by reference herein, disclose microelectronic contacts having asperities to scrape a contacting solder ball or pad in order to break through the oxide layer. Preferably, the asperities are formed from beryllium copper or another conducting substance.

In many applications, microelectronic contacts and sockets are reused by removing one microelectronic element and replacing it with a second microelectronic element. For example, an assembly may be tested before bonding the contacts on the substrate to terminals on the microelectronic element. If the microelectronic element fails, it may be replaced by another microelectronic element, which is bonded to the substrate after passing the test. In another example, a substrate having sockets may be used as a test fixture for testing numerous successive microelectronic elements. In both cases, the sockets or contacts must withstand multiple wiping contacts with solder balls or pads on the microelectronic element.

Although the foregoing commonly assigned patents offer significant advantages, still further improvements in contacts are desirable.

SUMMARY OF THE INVENTION

The present application discloses a process for creating wear resistant edges for contacts. The wear resistant edge permits the reuse of the contact as described above without rapid degradation of the contact due to wear. Furthermore, the hard contact edge of the present invention enhances the wiping and scraping action that uncovers the underlying un-oxidized metal of the solder ball or pad.

The present invention relates to a method of making a contact having a wear resistant edge. The method of this aspect of the invention includes the step of providing a composite or laminate structure which includes a substrate and a conductive layer. A photoresist layer is then formed on the conductive layer. The photoresist layer is patterned to expose portions of the conductive layer. The exposed portions are etched to form contacts having etched edges. A wear resistant material is then plated onto the etched edges to form wear resistant edges. The patterned photoresist layer is then stripped. The top portion of each contact is then etched to a predetermined height which is below the height of the associated wear resistant edge so that the wear resistant etch protrudes above the surface of the contact.

The present invention also relates to a method making a contact having an aperture opening which is defined by a plurality of electrically conductive contact tabs. Each of the contact tabs has a wear resistant edge. The method of this aspect of the invention comprises the step of patterning a first photoresist layer which is disposed on the conductive layer of the composite structure. The conductive layer is etched to form a plurality of tabs. The edges of the tabs are then plated with a wear resistant material. The first photoresist layer is stripped and a second photoresist layer is formed on the conductive layer. The second photoresist layer is patterned to define the outline of the contact. The conductive layer is exposed to a second etching step to form the outline of the contact. The contact tabs are disposed within the outline of the contact. In preferred embodiments, the contact tabs are extend radially inward and form an aperture in the conductive layer. The top portion of each contact is also etched to a predetermined height which is less than the height of the associated wear resistant edge.

BRIEF DESCRIPTION OF THE DRAWINGS

FIG. 1A is a side view of a metal clad composite structure used in the method of one embodiment of the present invention.

FIG. 1B is a side view of the composite structure of FIG. 1A after a photo resist layer has been formed and patterned.

FIG. 1C is a side view of the assembly of FIG. 1B after the metal layer in the composite structure has been etched.

FIG. 1D is a side view of the assembly of FIG. 1C after the etched edges of the metal layer have been plated with a wear resistant material to form a wear resistant edge.

FIG. 1E is a side view of the assembly of FIG. 1D after the patterned photoresist layer has been stripped.

FIG. 1F is a side view of the assembly of FIG. 1E after the top portion of the metal layer of the composite structure has been etched to a predetermined height which is below the height of the wear resistant edge.

FIG. 1G is a cross-sectional side view of contact having a wear resistance edge that can be made in another embodiment of the method of the present invention.

FIG. 1H is a cross-sectional side view of a contact having a central aperture and wear resistant edges.

FIG. 1I is a cross-sectional side view of a contact having a plurality of contact tabs having wear resistant edges, wherein such contact tabs are disposed over a hole in the substrate.

FIG. 2A is a top plan view of a patterned photoresist layer disposed over a metal clad composite structure.

FIG. 2B is a top plan view of the assembly of FIG. 2A after the metal layer of the composite structure has been etched.

FIG. 2C is a top plan view of the assembly of FIG. 2B after the etched edges of the metal layer have been plated with a wear resistant material to form wear resistant edges.

FIG. 2D is a top plan view of the assembly of FIG. 2C after the pattern photoresist layer has been stripped and the top portion of the metal layer of the composite structure has been etched to a predetermined height which is below the height of the wear resistant edge.

FIG. 2E is a top plan view of the assembly of FIG. 2D after a second photoresist layer has been deposited and patterned.

FIG. 2F is a top plan view of the assembly of FIG. 2E after the metal layer has been exposed to a second etching process to define the outer peripheries of the contacts and the patterned photoresist has been stripped.

FIG. 3A is a top plan view of a metal clad composite structure having a plurality regions each having a layer of patterned photoresist.

FIG. 3B is a top plan view of the assembly of FIG. 3A after the metal of the composite structure has been etched and a wear resistant material has been plated on the etched edges of the metal to form wear resistant edges.

FIG. 3C is a top plan view of the assembly of FIG. 3B after the patterned photoresist layers have been stripped and the top portion of the metal layer has been etched to a predetermined height which is below the height of the wear resistant edges.

DETAILED DESCRIPTION OF THE PREFERRED EMBODIMENTS

Figure 1A:
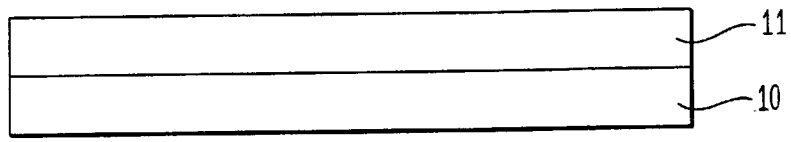
FIGS. 1A–1I are cross-sectional side views of progressive steps in the method of the present invention.

In FIGS. 1A–1F of the present application, a process is disclosed for forming a hard edge on the tip of a contact, which is raised slightly above the surface of the contact. Such figures, as well as the FIGS. 1G–1I, 2A–2F and 3A–3C, are not drawn to scale. A metal clad composite structure, as shown in FIG. 1A, is first provided, having a layer 10 of a substrate material such as polyimide and a layer 11 of conductive material, such as copper sheet. The layers of the composite structure may be laminated together using an adhesive. The copper layer may be deposited directly on the substrate or a tie coat may be applied to the substrate to so that the copper layer can be sputter or plated onto the substrate.

Figure 1B:
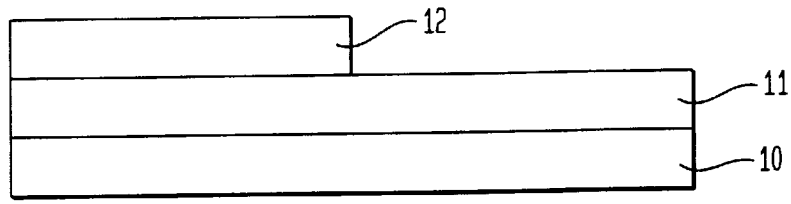

An image pattern of a photoresist material 12 is formed on the metal layer 11 as shown in FIG. 1B. The image pattern is a representation of contacts, contact tabs, leads and/or other electrically conductive features to be formed on the substrate 10 and may be deposited using photolithography or other means.

Figure 1C:
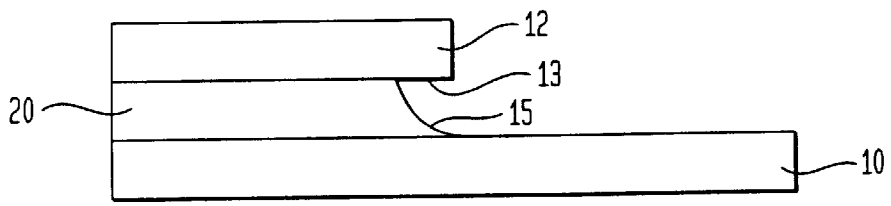
Figure 1D:
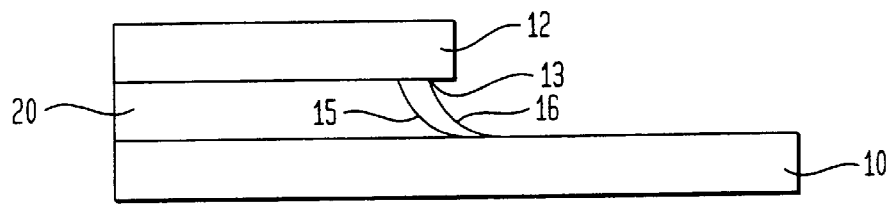
Figure 1E:
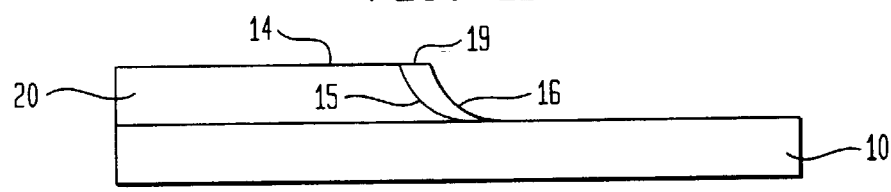
Figure 1F:
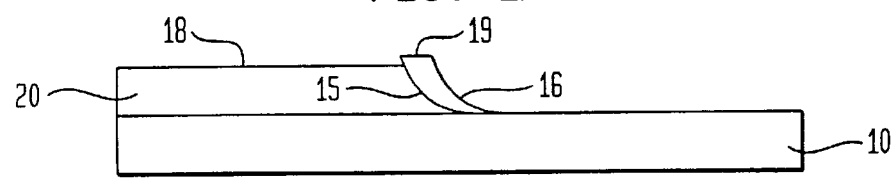
Figure 1G:
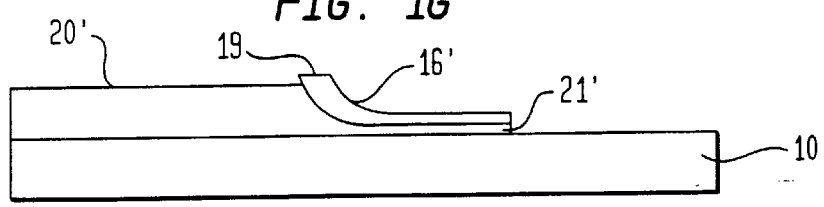

After the image pattern 12 is formed, the metallic layer 11 is etched using a suitable etching solution, as shown in FIG. 1C, forming conductive elements 20 having undercuts 15 around their edges. A lip 13 beneath the photoresist layer 12 is formed by the undercut 15 around the outer edge of the conductive element 20.

The conductive elements 20 are next plated with rhodium, osmium or another hard electrically conductive substance to form an edge layer 16. Only the exposed surfaces of the conductive elements 20, between the base substrate 10 and the photoresist 12, are plated. The exposed lip 13 surrounding each conductive element 20 forms the upper boundary of the edge layer 16.

The photoresist 12 is then removed using a solvent or other stripping method, exposing the upper surface 14 of the conductive elements 20, and the upper surface 19 of the edge layer 16. The entire assembly is then exposed to an etching agent, which removes material from the exposed surfaces of the conductive elements 20 at a predetermined rate. This etching solution optimally does not affect (etch) the edge layer material 16 or etches it at a rate substantially slower than the etching of the conductive element material 20. Only the upper surface 14 is etched, the other surfaces being covered by edge layer 16. The upper surface is etched to form a new upper surface 18 below the upper surface 19 of the edge layer 16. The resulting contact comprises a conductive element 20 having an upper surface 18, and having an outer edge layer 16 with an upper surface 19 higher than the upper surface 18 of the conductive element 20. In preferred embodiments, the top surface of the contact is from 2 to 10 microns below the top surface of the wear resistant edge. The upper surface 19 of the edge layer 16 serves as a hard asperity for wiping or scraping in contact with a solder ball or contact pad. Furthermore, the entire edge layer 16 is formed of a hard, wear resistant material, permitting the reuse of the contact without rapidly wearing the contact edge.

If there is a concern that this wiping action will eventually cause a separation of the edge layer 16 and the conductive element 20, the edge layer 16' (FIG. 1G) may be extended a short distance along the surface of the substrate 10 to aid in withstanding lateral wiping forces. Typically, a thin layer 21 of the conductive element material 20' will be left after etching such that it extends along the surface of substrate 10 to aid in the deposition or electroplating of edge layer 16'.

Figure 1H:
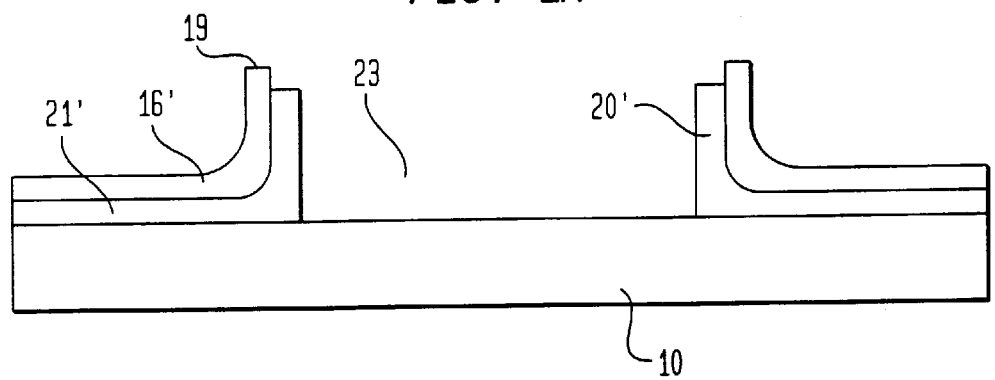
Figure 1I:
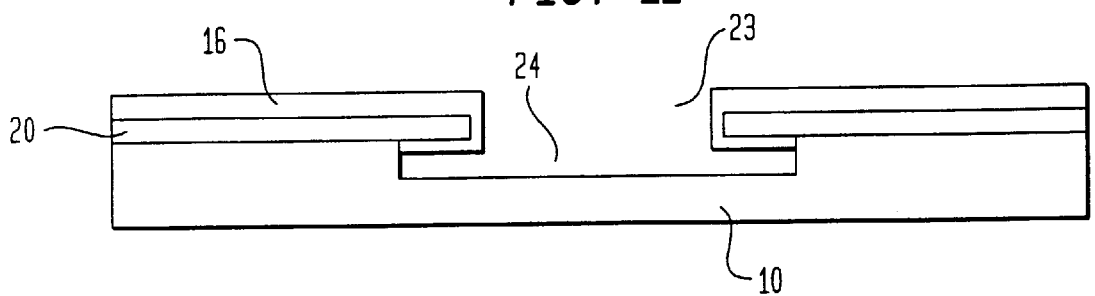
Figure 1J:
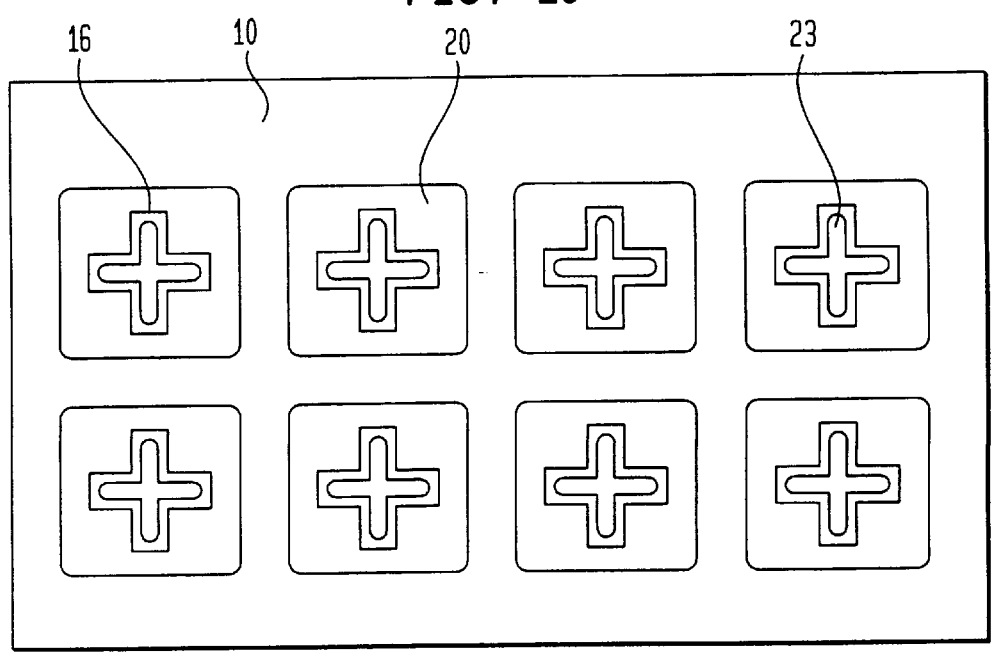
FIG. 1J is top plan view of a connection component having a plurality of sockets arranged in a grid-like array.

Metallic features or contact tabs may be used in groups extending radially inward from a peripheral contact to form a socket. In use, the group of contact tabs simultaneously engages a solder ball or other protruding feature. Such a microelectronic socket is disclosed in the '699 patent referenced above. As depicted in FIG. 1H, a socket may be formed of such a group of radially extending contact tabs wherein each of the contact tabs has a wear resistant edge. Two such contact tabs 22 are depicted in FIG. 1H. Each group of tabs may form an aperture 23 in contact 20. Each group of contact tabs may extend over a hole 24 in the substrate, as depicted in FIG. 1I. As depicted in FIG. 1J, a plurality of sockets, each having a group of radially extending tabs with wear resistant edges, may, for example, be arranged in a grid array to form a connection component. A microelectronic chip having an array of solder balls may be connected to such component by engaging each of the solder balls with one of the sockets. In an alternative embodiment to the connection component depicted in FIG. 1I and to accommodate the solder balls, the substrate may have a plurality of holes, wherein each of the holes is disposed beneath one of the groups of contact tabs.

Figure 2A:
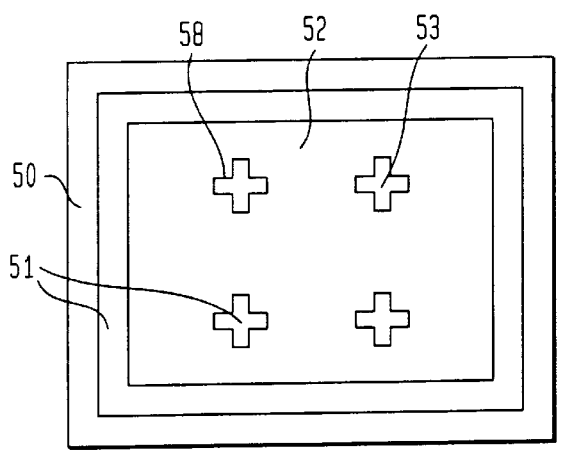
FIGS. 2A–2F are top plan views of progressive steps in another embodiment of the present invention.
Figure 2D:
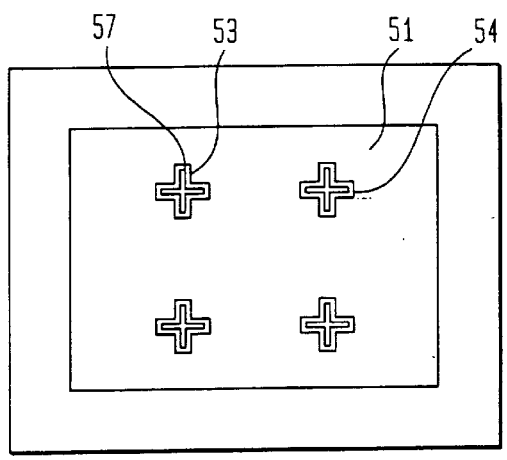
Figure 2B:
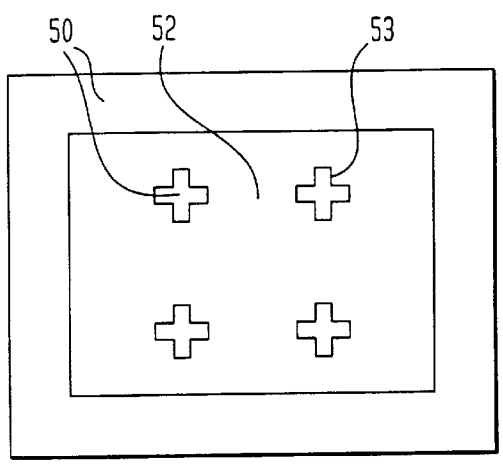

FIGS. 2A–2F disclose a process for creating wear resistant contact edges on the tabs of such sockets. In the first step of the process shown in FIG. 2A, a substrate 50 such as a polyimide sheet having a metallic layer 51 such as a copper layer, is covered with a photoresist pattern 52 forming apertures 53 defining the edges of contact tabs 58. The substrate is then exposed to an etching agent, which removes the exposed metallic layer 51, forming apertures 53 and exposing the substrate 50 below, as shown in FIG. 2B.

A hard metal such a rhodium or osmium is next plated in a pattern within the apertures 53 (FIG. 2C), forming contact edges 54 defining a contact aperture 57. The hard metal contact edges 54 abut the metallic layer 51 around the edges of the aperture 53. Some metallurgical bonding occurs at the interface between the hard metal and the surrounding metal, forming a continuous metallic feature.

The photoresist 52 is then stripped as shown in FIG. 2D, exposing the remaining portion of the metallic sheet 51. The metallic sheet 51 forms a continuous layer with the contact edge 54, which, in turn, defines the contact aperture 57.

Figure 2E:
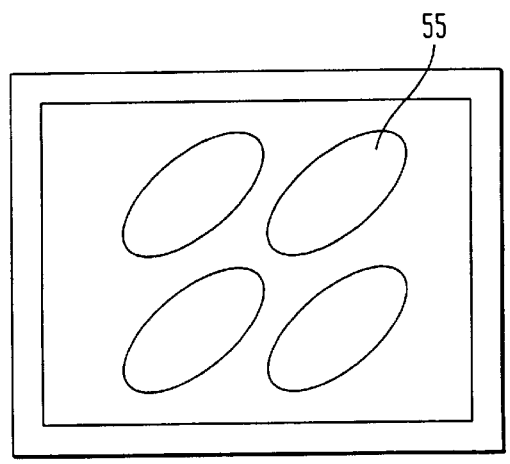
Figure 2C:
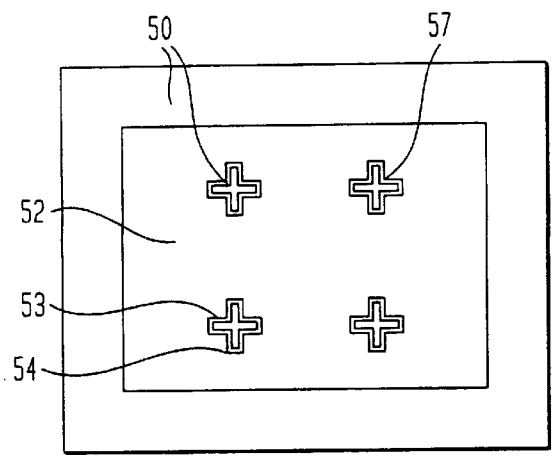

An additional resist pattern 55 is next applied to the sheet, as shown in FIG. 2E. The resist pattern 55 defines contacts surrounding the contact edges 54. In a preferred embodiment, the resist pattern 55 forms contacts arranged diagonally with respect to the horizontal and vertical array, to provide locations between the contact edge patterns for connection through the underlying substrate.

Figure 2F:
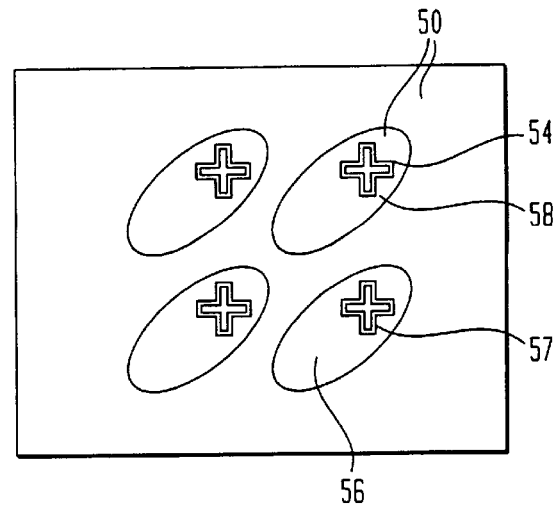

The metallic layer 51 is then etched, the resist pattern is removed, and the contacts 56, shown in FIG. 2F, remain. The contacts 56 are then etched to reduce their thickness slightly as compared to the hard metal contact edges 54. The contact edges will therefore extend slightly above the surrounding copper, in a manner similar to that shown in FIG. 1F.

The area of the contact 56 opposite the contact edge pattern 54 may be connected to circuitry on the other side of the substrate 50 through a via or other means. A hole (not shown) may be formed in the substrate 50 beneath the contact edge pattern 54 to permit the contact edges to deflect in a downward direction when a solder bump or other electrical connector is pressed onto the contact edge pattern 54. The tabs 58, defined by the contact aperture 57, have edges 54 formed of rhodium, osmium or another hard metal. Those hard edges enhance wiping contact to expose the un-oxidized material beneath the oxide coating of a solder bump, and provide wear resistance and durability for repeated contact with solder bumps.

In an alternative embodiment of the process step shown in FIG. 2E, a reverse of the photoresist pattern shown may be applied having apertures where photoresist pads 55 are shown. In that embodiment, gold is plated into the apertures to form two-layer contacts having copper and gold layers, the photoresist is removed and the remaining copper is then etched away.

Figure 3A:
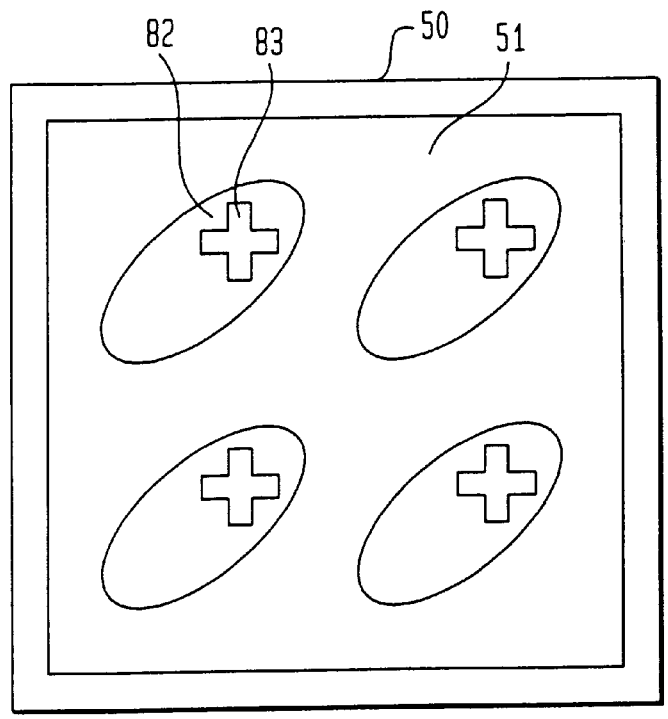
FIGS. 3A–3C are top plan views of progressive steps in another embodiment of the present invention.
Figure 3B:
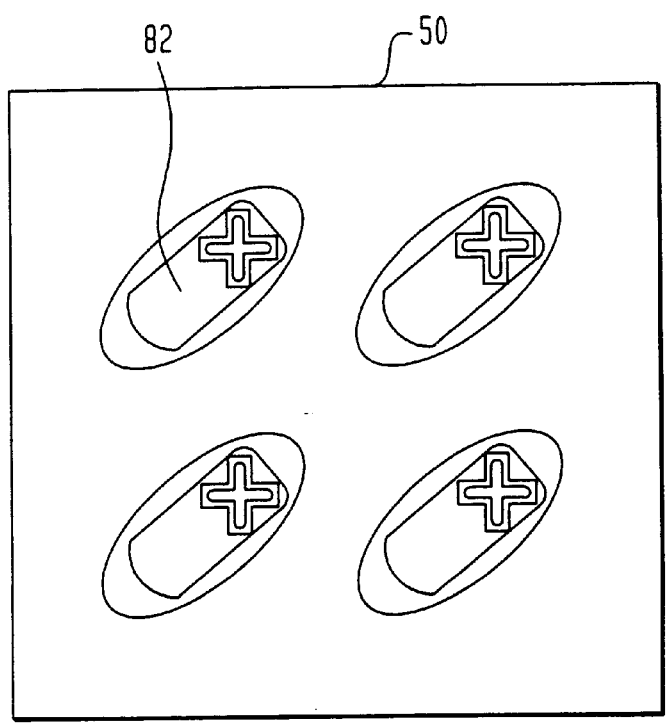
Figure 3C:
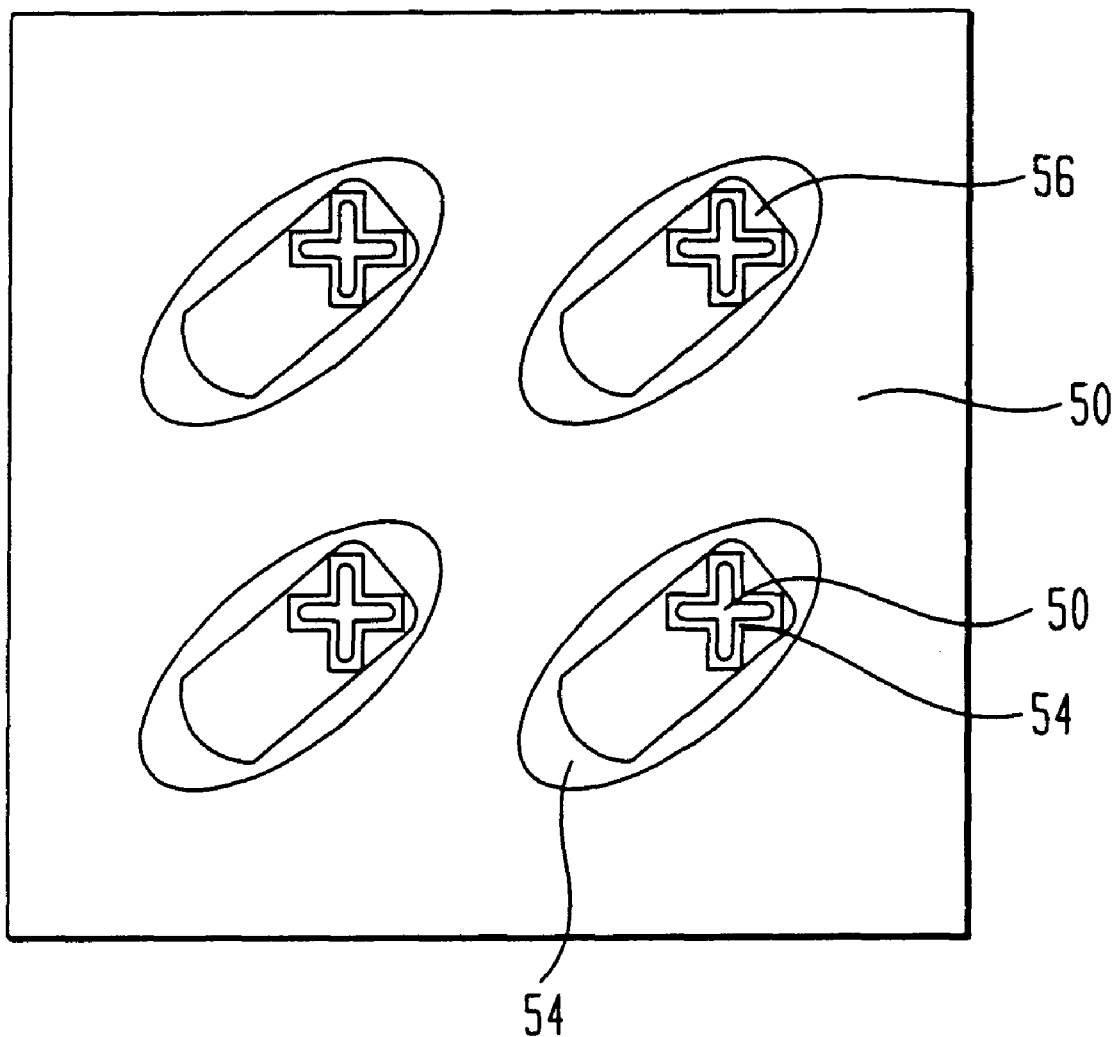

In another embodiment of the invention, a photoresist pattern is formed on the copper layer, and defines both the aperture 83 and the outer boundaries of the contact pads 82, as shown in FIG. 3A. The exposed copper is then etched and rhodium or another hard metallic material is used to plate all edges of the contact, including the edges surrounding the aperture 83 and the edges surrounding the contact pad 82, as shown in FIG. 3B. The resist is then stripped from over the copper contacts as shown in FIG. 3C, and the copper is etched to a thickness less than that of the hard metal edges, forming raised contact edges, as in the previous embodiments.

The substrate may be comprised of a rigid, semi-rigid or flexible dielectric material. In preferred embodiments, the substrate material is a thin, flexible sheet of a polymeric material selected from the group consisting of polyimides, fluoropolymers, thermoplastic polymers and elastomers, with polyimides being particularly preferred. The conductive layer may be comprised of an electrically conductive material. In preferred embodiments, the electrically conductive material is a thin sheet of metal, with copper sheets being particularly preferred.

A plurality of contacts may be simultaneously made using the methods of the present invention. One or more such contacts may be disposed on a microelectronic component. Such microelectronic components include, but are not limited to semiconductor chips, wafers, circuit panels, circuit boards, hybrid substrates, and connection components, such as connectors, sockets, and chip carriers.

As these and other variations and combinations of the features discussed above can be utilized without departing from the present invention as defined by the claims, the foregoing description of the preferred embodiments should be taken as illustrating, rather than limiting, the invention as claimed.

That which is claimed is:

1. A method of making a contact having a wear resistant edge, said method comprising the steps of:

A. providing a composite structure comprising
      a substrate; and
      a conductive layer;
   B. depositing a photoresist on the conductive layer to form a photoresist layer;
   C. patterning the photoresist layer to form an exposed portion of the conductive layer;
   D. forming a contact having an etched edge by etching the exposed portion of the conductive layer;
   E. plating a wear resistant material on the etched edge to form a wear resistant edge;
   F. stripping the patterned photoresist layer; and
   G. etching the top portion of the contact to a predetermined height which is below the height of the wear resistant edge.

2. The method of claim 1, wherein the contact formed in step (D) includes a central portion having a first height and a periphery portion having a second height and wherein the first height is greater than the second height.

3. The method of claim 2, wherein the wear resistant edge formed in step (E) is disposed on the edges of the central portion and the periphery portion.

4. The method of claim 2, wherein the central portion has an aperture.

5. The method of claim 1, wherein the substrate is a thin, flexible sheet of a polymeric material selected from the group consisting of polyimides, fluoropolymers, thermoplastic polymers and elastomers.

6. The method of claim 1 wherein the composite structure is comprised of copper clad polyimide.

7. The method of claim 1, wherein the wear resistant material is selected from the group consisting of rhodium and osmium.

8. The method of claim 1, wherein the contact formed in step (D) includes a plurality of contact tabs which extend radially inward.

9. The method of claim 1, further comprising the step of plating gold on the contact.

10. A method of making a contact having a wear resistant edge, said method comprising the steps of:
   A. providing a composite structure comprising
      a substrate; and
      a conductive layer;
   B. depositing a photoresist on the conductive layer to form a first photoresist layer;
   C. patterning the first photoresist layer to form a hole which defines the outlines of a plurality of contact tabs and exposes a portion of the conductive layer;
   D. etching the exposed portion of the conductive layer to form the plurality of contact tabs which define an aperture in the conductive layer wherein each of the contact tabs has an etched edge;
   E. plating a wear resistant material on the etched edge of each contact tab to form wear resistant edges;
   F. stripping the first photoresist layer;
   G. depositing a photoresist on the conductive layer to form a second photoresist layer;
   H. patterning the second photoresist layer to form the outline of a contact, wherein the plurality of contact tabs are disposed within the outline of the contact;
   I. etching the conductive layer to form the contact;
   J. stripping the second photoresist layer; and
   K. etching the top portion of the contact to a predetermined height which is less than the height of the wear resistant edges.

11. The method of claim 10, wherein the substrate has a hole disposed beneath the aperture.

12. The method of claim 10, wherein the substrate has a bottom surface and a top surface, the conductive layer is disposed on the surface and a plurality of circuit features are disposed on the bottom surface.

13. The method of claim 12, wherein each contact is electrically interconnected to one of the plurality of circuit features.

14. The method of claim 10, wherein the wear resistant material is selected from the group consisting of osmium and rhodium.

15. The method of claim 10, further comprising the step of plating gold onto each contact.

16. The method of claim 1, wherein a plurality of contacts are simultaneously formed.

17. The method of claim 16, wherein the apertures of the plurality of contacts are arranged in a grid-like array and the contacts are oriented diagonally with respect to the array.

18. A method of making a contact having a wear resistant edge, said method comprising the steps of:
   A. providing a composite structure comprising
      a substrate; and
      a conductive layer;
   B. depositing a photoresist on the conductive layer to form a photoresist layer;
   C. patterning the photoresist layer to form openings which define the outline of a contact and the outlines of a plurality of contact tabs disposed within the outline of each contact and which exposes a portion of the conductive layer;
   D. etching the exposed portion of the conductive layer to form a contact and a plurality of contact tabs within the contact, wherein the plurality of contact tabs an aperture in the conductive layer, and wherein each of the contact tabs has an etched edge;
   E. plating a wear resistant material on the etched edge of each contact tab to form a wear resistant edge on each contact tab;
   F. stripping the first photoresist layer; and
   G. etching the top portion of each contact tab to a predetermined height which is less than the height of the wear resistant edges of the contact tab.

19. The method of claim 18, wherein the composite structure is comprised of copper clad polyimide.

20. The method of claim 18, wherein the wear resistant material is selected from the group consisting of rhodium and osmium.

21. A method of making a contact for a microelectronic component, said method comprising providing a composite structure including a substrate and at least one electrically conductive contact having an upper surface, a lower surface disposed on the substrate and an edge connecting the upper surface to the lower surface, and depositing a wear resistant material at least on said edge of said contact to form a wear resistant edge thereat.

22. The method of claim 21, further including removing a portion of said upper surface of the contact such that the resulting upper surface is at a predetermined height from the substrate which is below the height of the wear resistant edge.

23. The method of claim 21, wherein the contact includes a central portion having a first height and a periphery portion having a second height and wherein the first height is greater than the second height.

24. The method of claim 23, wherein the wear resistant material is deposited on the central portion and the periphery portion to form a wear resistant edge thereat.

25. The method of claim 21, wherein the substrate comprises a flexible sheet of polymeric material selected from the group consisting of polyimides, fluoropolymers, thermoplastic polymers and elastomers.

26. The method of claim 21, wherein the contact comprises an electrically conductive material selected from the group consisting of copper and copper alloys.

27. The method of claim 21, wherein the wear resistant material is selected from the group consisting of rhodium and osmium.

28. The method of claim 21, wherein the contact includes a plurality of contact tabs which extend radially inward.

29. The method of claim 21, further including forming a plurality of contacts each having a wear resistant edge.

30. A method of making a contact having a wear resistant edge for a microelectronic component, said method comprising providing a composite structure including a substrate and a conductive layer having an upper surface and a lower surface, said conductive layer forming a plurality of contact tabs, each of the contact tabs having a contact tab edge connecting the upper surface to the lower surface, wherein the plurality of contact tab edges define therebetween an aperture extending from the upper surface to the lower surface; depositing a wear resistant material on at least the edge of each contact tab to form wear resistant edges thereat; and forming at least one contact having at least one contact tab having a wear resistant edge disposed within an outline of the contact.

31. The method of claim 30, further including removing a portion of the upper surface of the at least one contact such that the resulting upper surface of the contact is at a predetermined height which is less than the height of the wear resistant edges.

32. The method of claim 31, wherein the substrate has a hole disposed beneath the aperture.

33. The method of claim 30, wherein the substrate has a bottom surface and a top surface, the lower surface of the conductive layer being disposed on the top surface of the substrate and a plurality of circuit features disposed on the bottom surface of the substrate.

34. The method of claim 33, further including forming a plurality of contacts, each contact electrically interconnected to one of the plurality of circuit features.

35. The method of claim 30, wherein the wear resistant material is selected from the group consisting of osmium and rhodium.

36. The method of claim 30, further comprising plating gold onto said conductive layer.

37. The method of claim 30, further including forming a plurality of contacts, each contact having an aperture, the apertures arranged in a grid-like array, and the contacts are oriented diagonally with respect to the array.

38. The method of claim 30, wherein the substrate comprises polyimide, and the conductive layer comprises copper.

39. The method of claim 38, wherein the wear resistant material is selected from the group consisting of rhodium and osmium.

40. A method of making a contact having a wear resistant edge for a microelectronic component, said wear resistant edge adapted for engagement with an electrical conductive element of another microelectronic component, said method comprising providing a substrate, forming on said substrate at least one contact having an edge, and selectively depositing wear resistant material at least on said edge to form a wear resistant edge thereat.

41. The method of claim 40, further including removing a portion of said contact adjacent said wear resistant edge whereby the height of said contact adjacent said wear resistant edge is less than the height of said wear resistant edge.

* * * * *

UNITED STATES PATENT AND TRADEMARK OFFICE
CERTIFICATE OF CORRECTION

PATENT NO. : 6,317,974 B1
DATED : November 20, 2001
INVENTOR(S) : Joseph Fjelstad Page 1 of 1

It is certified that error appears in the above-identified patent and that said Letters Patent is hereby corrected as shown below:

Title page,
Item [74], "Krumhholz" should read -- Krumholz --.

Column 1,
Line 7, "disclosures" should read -- disclosure --.

Column 2,
Line 24, after "method" insert -- of --.
Line 39, "extend" should read -- extended --.
Line 63, after "of" insert -- a --.

Column 3,
Line 34, after "plurality" insert -- of --.
Line 59, cancel "to" (second occurrence).
Line 60, "sputter" should read -- sputtered --.

Column 5,
Line 10, "a" (second occurrence) should read -- as --.

Column 7,
Line 32, after "the" insert -- top --.
Line 62, after "tabs" insert -- form --.

Signed and Sealed this

Twenty-first Day of May, 2002

Attest:

*Attesting Officer*

JAMES E. ROGAN
*Director of the United States Patent and Trademark Office*